United States Patent
Muramoto

[11] Patent Number: 5,825,062
[45] Date of Patent: Oct. 20, 1998

[54] SEMICONDUCTOR DEVICE INCLUDING A NONVOLATILE MEMORY

[75] Inventor: Jun Muramoto, Kyoto, Japan

[73] Assignee: Rohm Co., Ltd., Kyoto, Japan

[21] Appl. No.: 762,769

[22] Filed: Dec. 10, 1996

[30] Foreign Application Priority Data

Dec. 12, 1995 [JP] Japan ...................................... 7-322107

[51] Int. Cl.⁶ ................................................. H01L 29/788
[52] U.S. Cl. .......................... 257/315; 257/316; 257/317; 257/319; 257/320
[58] Field of Search .................................. 257/315, 316, 257/317, 319, 320, 321, 322

[56] References Cited

U.S. PATENT DOCUMENTS

| | | | |
|---|---|---|---|
| 5,200,919 | 4/1993 | Kaya | 257/322 |
| 5,402,371 | 3/1995 | Ono | 257/315 |
| 5,457,652 | 10/1995 | Brahmbhatt | 257/315 |
| 5,477,068 | 12/1995 | Ozawa | 257/315 |

*Primary Examiner*—Carl W. Whitehead, Jr.
*Attorney, Agent, or Firm*—Merchant, Gould, Smith, Edell, Welter & Schmidt

[57] ABSTRACT

Pulse shaped voltage of 5V is applied to a source region 3 at initial phase of erase by a pull back voltage generator 13 connected to the sources region 3. Then, the pulse shaped voltages of 10V and 12V increased under stepwise bases are applied to source region 3 with progress of erasion. Generation of hot-holes at the initial phase of data erasion can be prevented because difference in voltage between the floating gate electrode 5 and source region 3 is decreased. Value of the pulse shaped voltage thus applied is increased for the difference occurred between the floating gate electrode 5 and source region 3 when erasion is in much progress. Thus, it is possible to pull out the stored electrons from the floating gate electrode 5 until the threshold voltages can be set at predetermined values. So that, degradation of characteristics of a gate oxidation layer caused by hot-holes generated with erasion can be prevented.

14 Claims, 5 Drawing Sheets

SEMICONDUCTOR DEVICE INCLUDING A NONVOLATILE MEMORY

CROSS-REFERENCE TO RELATED APPLICATIONS

This application is based on Application No. Hei 7-322107 filed on Dec. 12, 1995 in Japan, the content of which is incorporated hereinto by reference.

BACKGROUND OF THE INVENTION

1. Technical Field of the Invention

The present invention relates to a semiconductor device including a nonvolatile memory having a floating gate electrode and a method of using thereof, more specifically, a semiconductor device which increases repeatability of data writing/data erasing.

2. Prior Art

Now, an flash type EEPROM (electrically erasable programmable read only memory, hereinafter referred to as flash memory) is known as a writable nonvolatile memory. FIG. 5 shows a flash memory cell 51 which is one of the cells consisting the flash memory. In the flash memory cell 51, an $n^+$type source 3 is formed in a p type substrate 2. Also, a gate oxidation layer (tunnel oxidation layer) 6 is formed on the substrate 2 in thickness of 10 nm. Further, a floating gate electrode 5 made of conductive material, an inter-insulating layer 9 and a control gate electrode 7 are formed on the gate oxidation layer 6 one after another in that order.

In the flash memory cell 51, write state is made by injecting electrons into the floating gate electrode 5, and the memory cell 51 is turned to erase state when the electrons stored in the floating gate electrode 5 are pulled out. Threshold voltage of the control gate electrode 7 required to form a channel in a channel region 11 is varied depend upon the number of the electrons stored in the floating gate electrode 5. It is possible to distinguish whether the memory cell is turned to the write state or the erase state by detecting variation of the number of the electrons.

In order for the memory cell 51 turning to the erase state, a voltage of 12 V is applied to the source 3 and a drain is opened, and both of the control gate 7 and the substrate 2 are in the ground voltage. The electrons stored in the floating gate electrode 5 are pulled out to the source 3 using a current flows under F-N (Fowler-Nordheim) tunneling.

However, the flash memory cell 51 has following problems to be resolved. A high voltage is applied to the source 3, by turning the control gate 7 and the substrate 2 into a level of ground voltage when data erasion (when the electrons stored in the floating gate electrode 5 are pulled out) is carried out. In this case, "trapping-level" is occurred in the gate oxidation layer 6. Because hot-holes generated at a side of the source 3 are injected into the gate oxidation layer 6, and much current so called "band to band current" flows from the source 3 to the substrate 2. As a result, so called "window narrowing" of data writing/data erasing (W/E) state is accelerated, so that repeatability of the W/E state is degraded.

If a lower voltage is applied to the source 3 in order to prevent generation of the hot-holes, neither predetermined numbers of the electrons can not be pulled out from the floating gate electrode 5 nor longer time is required for data erasion.

SUMMARY OF THE INVENTION

It is an object of the present invention to provide a semiconductor device including a nonvolatile memory and a method of using thereof both of which prevent degradation of repeatability of data writing/erasing and resolving the problem stated in the above.

In accordance with characteristic of the present invention, a semiconductor device including a nonvolatile memory comprises:
  a substrate having a source region and a drain region,
  a first insulating layer on the substrate, the first insulating layer being between source region and the drain region,
  a floating gate electrode on the first insulating layer,
  a second insulating layer on the floating gate electrode,
  a control gate electrode on the floating gate electrode, and
  a pull back voltage generator applying predetermined voltages between either of the source region and the control gate electrode or the drain region and the control gate electrode, the predetermined voltages being in low value at initial phase of pull back of electrons and being in high values increased under stepwise bases corresponding to pull back of the electrons.

Also, in accordance with characteristic of the present invention, a method for using a semiconductor device including a nonvolatile memory having a source region, a drain region, a control gate electrode and a floating gate electrode characterized of:
  applying predetermined voltages between either of the source region and the control gate electrode or the drain region and the control gate electrode for pulling back of electrons stored in the floating gate electrode to the source region or the drain region using a current flowing under Fowler-Nordheim tunneling, the predetermined voltages being in low value at initial phase of pull back of electrons and being in high values increased under stepwise bases corresponding to pull back of the electrons.

While the novel features of the invention are set forth in a general fashion, both as to organization and content, it will be better understood and appreciated, along with other objections and features thereof, from the following detailed description taken in conjunction with the drawings.

DETAILED DESCRIPTION OF THE INVENTION

Figure 1:
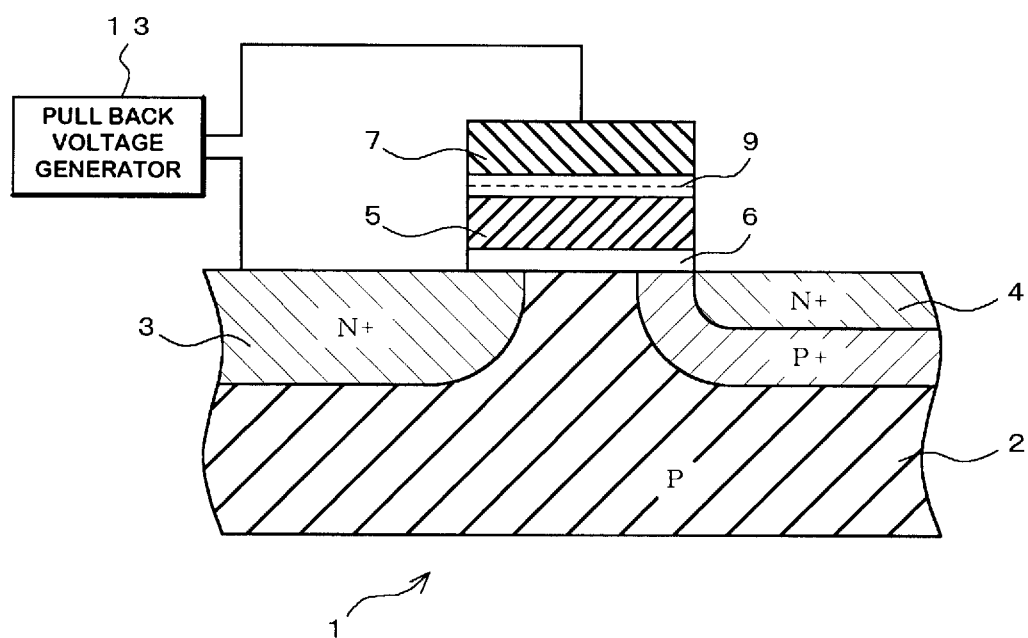
FIG. 1 is a sectional view showing the main part of a flash memory cell 1 in the present invention.

A flash memory cell 1 in an embodiment of the present invention will be described with reference to FIG. 1. Structure of the flash memory cell 1 is exactly the same as the conventional flash memory cell 51 described in the above. In other words, an n+ type source region 3 and a drain region 4 are formed in a p type substrate 2. And a gate oxidation layer 6 as the first insulating layer, a floating gate electrode 5, an inter insulating layer 9 as the second insulating layer and a control gate electrode 7 are formed on the substrate 2 one after another in that order.

Figure 2:
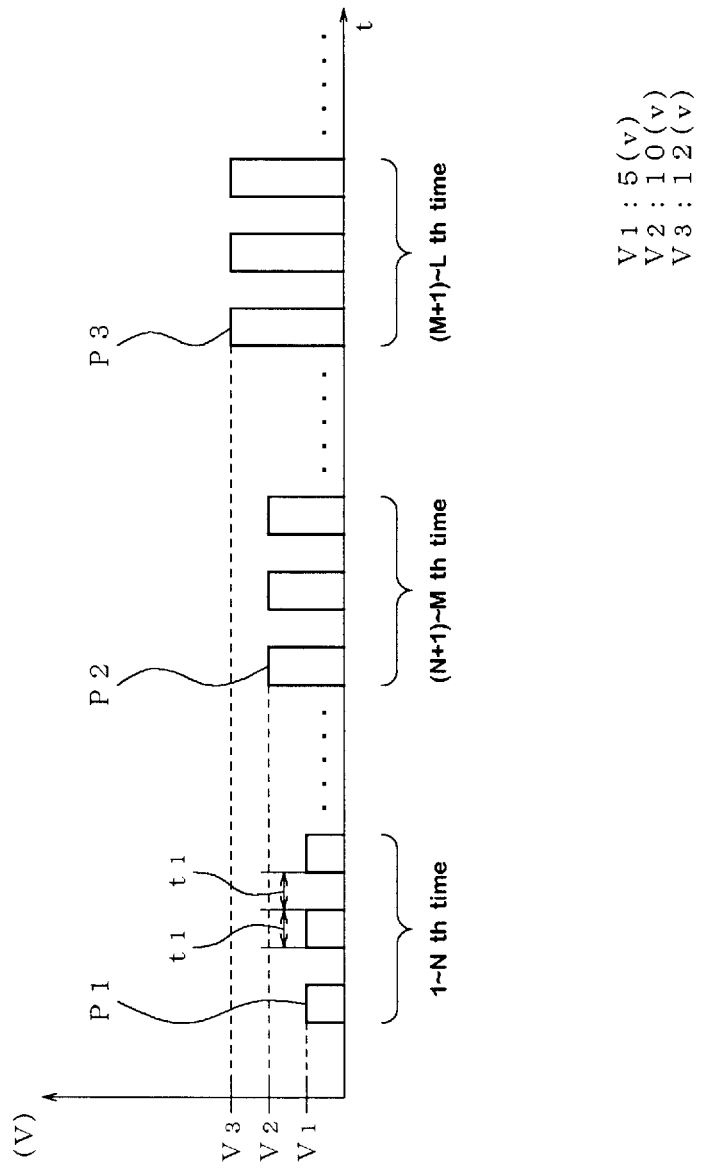
FIG. 2 is a graph showing pulse shaped voltages outputted by a pull back voltage generator 13 shown in FIG. 1.

A pull back voltage generator 13 is connected to the flash memory cell 1. Pulse shaped voltages (timing duration t1=10 ms) shown in FIG. 2 are generated by the pull back voltage generator 13. A voltage of V1 volts shown as a pulse P1, a voltage of V2 volts shown as a pulse P2 and a voltage of V3 volts shown as a pulse P3 are applied to the flash memory cell 1 until number of the voltage application reaches to the first time to N th time, (N+1) th time to M th time and (M+1) th time to the first time respectively.

Figure 3:
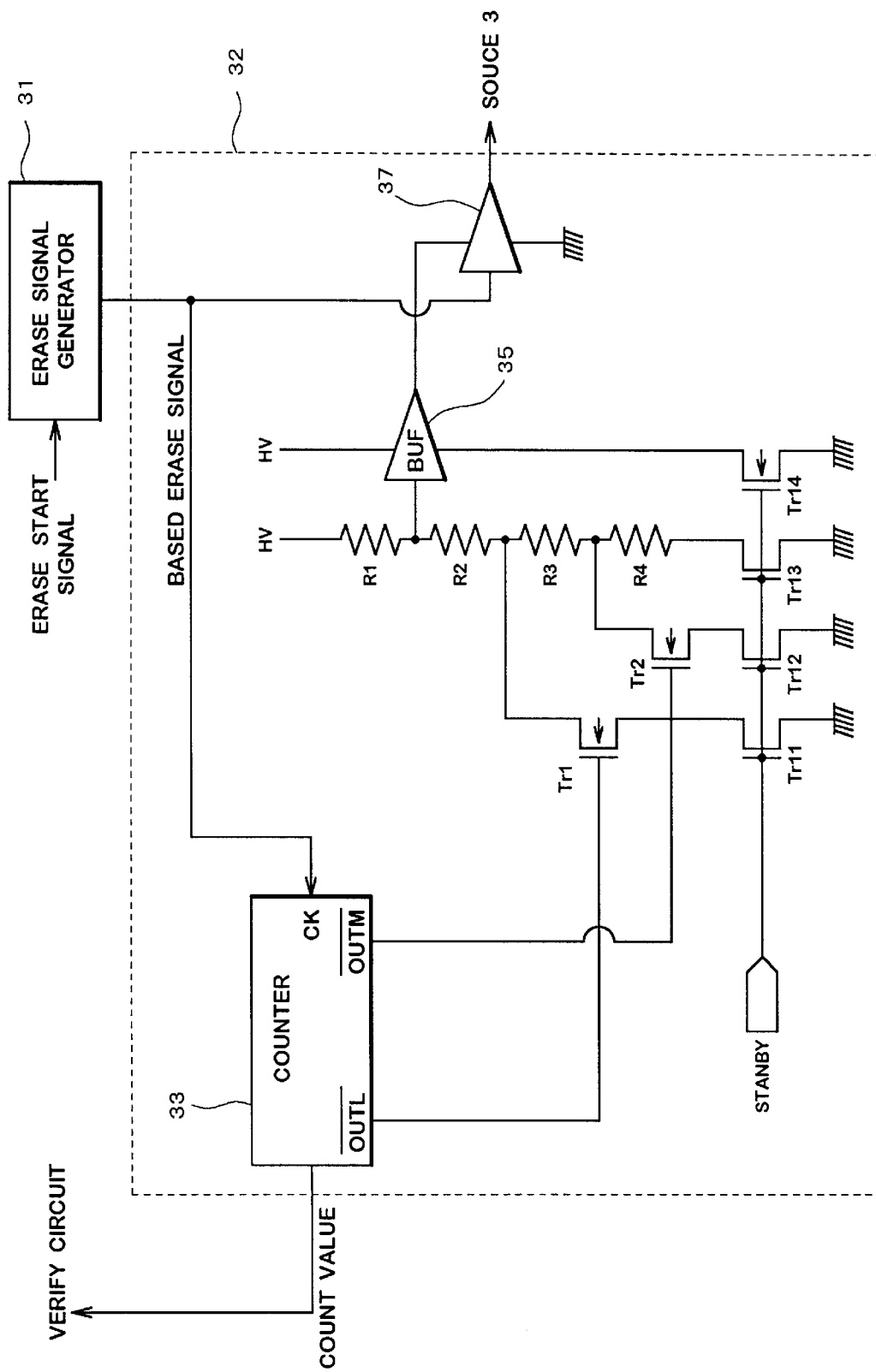
FIG. 3 is a circuit diagram of the pull back voltage generator 13.

Now, referring to FIG. 3 for describing as to structure of the pull back voltage generator 13. In this embodiment, the pull back voltage generator 13 is composed of an erase signal generator 31 well-known to the person skilled in the art and a voltage varying circuit 32 which varies value of the erase signal.

Figure 4:
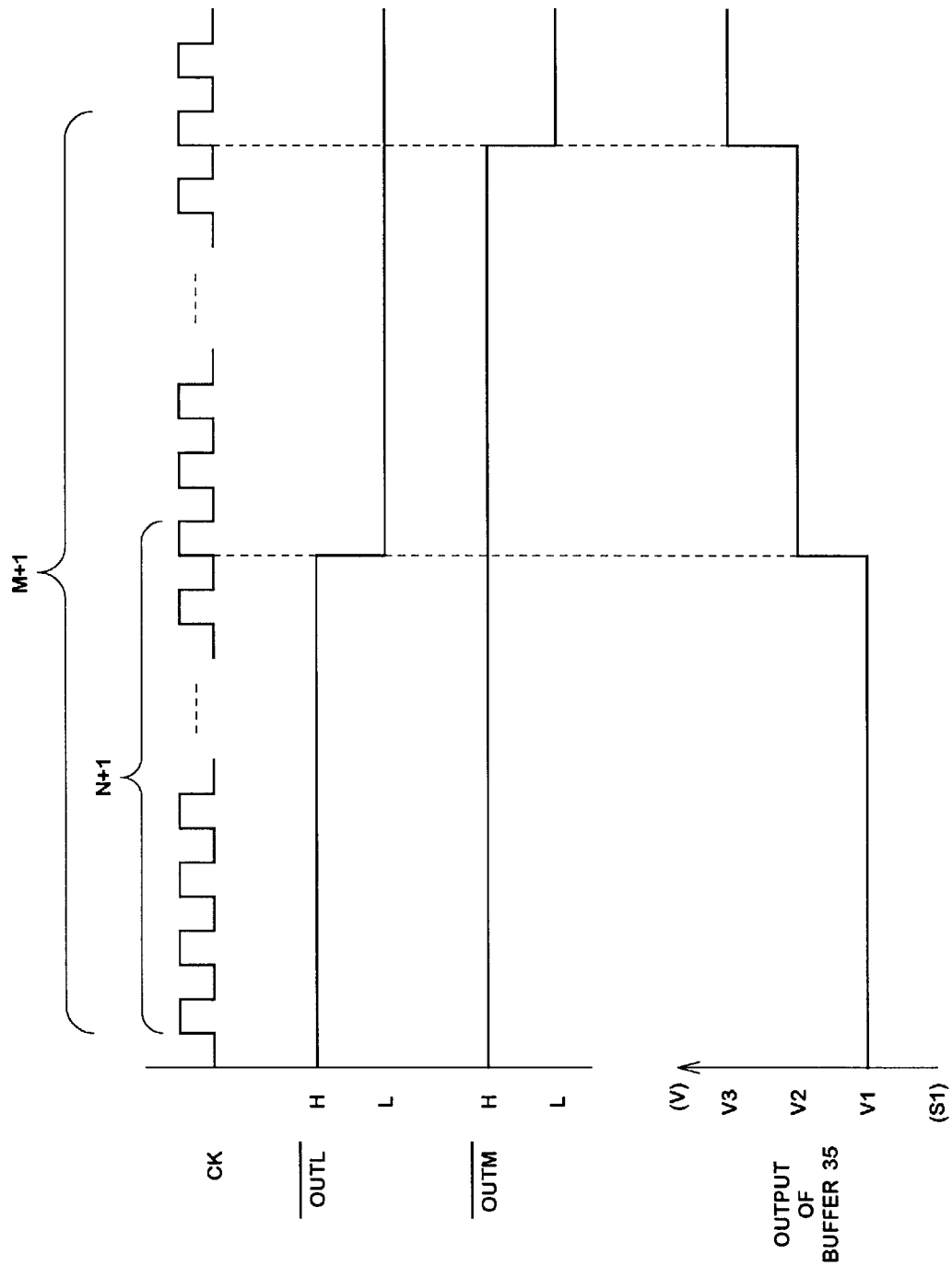
FIG. 4 is a timing chart of each terminals of the pull back voltage generator 13.
Figure 5:
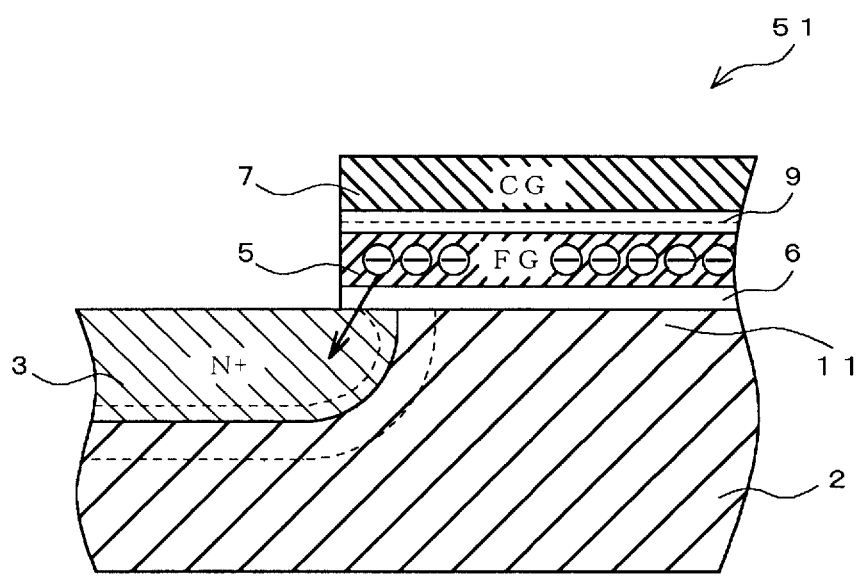
FIG. 5 is a sectional view for describing erase state of the conventional flash memory cell 51.

Based erase signal shown in FIG. 4 is outputted by the erase signal generator 31 when erase start signal is provided thereto.

Structure and function of the voltage varying circuit 32 is described herein. A high voltage (hereinafter referred to as HV, a value of 12V in this embodiment) is applied to a buffer 35 and one terminal of a resistance R1. Each of transistors Tr11, Tr12, Tr13 and Tr14 are turned to on-state when standby signal (High Active) is applied to a terminal STANBY. Thus, the buffer 35 is ready for operation. A counter 33 counts number of the based erase signals applied to a terminal CK, and it switches an output of an output terminal OUTL from High to Low when the counter 33 counts not less than a total of N+1 signals. Also, the counter 33 switches an output of an output terminal OUTM from High to Low when it counts not less than a total of M+1 signals. The transistor Tr1 and Tr2 are turned to the on-state when the output of High is applied to gates of the transistor Tr1 and Tr2.

The voltage generated by voltage divide using the resistance R1, a resistance R2 a resistance R3 and a resistance R4 are applied to the buffer 35 in accordance with either of the on-state or the off-state of the transistor Tr1, Tr2. For instance, a voltage of Vi applied to the buffer 35 is calculated under following equation when both of the transistor Tr1 and Tr2 are in the on-state.

$$Vi=HV*R2/(R1+R2)$$

Also, another voltage Vi applied to the buffer 35 is figured under following equation when the transistor Tr1 is in the off-state and the transistor Tr2 is in the on-state.

$$Vi=HV*(R2+R3)/(R1+R2+R3)$$

Still another voltage Vi applied to the buffer 35 is calculated under following equation when both of the transistor Tr1 and Tr2 are in the off-state.

$$Vi=HV*(R2+R3+R4)/(R1+R2+R3+R4)$$

The output of the buffer 35 is applied to a level shift circuit 37 as a supply voltage. Signal level of the erase signal is shifted by the level shift circuit 37. Then the shifted erase signal is provided to a source 3.

Operation of the pull back voltage generator 13 is described herein. Number of the based erase signal outputted from the erase signal generator 31 is counted by the counter 33. The counter 33 outputs high-signal to both the output terminal OUTL and the output terminal OUTM until when a total number of counted erase signals reaches to N. Thus, both the transistor Tr1 and the transistor Tr2 are turned to the on-state, so that a voltage of V1 volts is applied to the buffer 35 as shown in FIG. 4. An erase signal, voltage of V1 as shown in FIG. 2 is applied to the source 3 by carrying out level shifting of voltage of the erase signal.

Also, the counter 33 outputs low-signal to both the output terminal OUTL and the output terminal OUTM until when a total number of counted erase signals reaches to a total number of N+1. Thus, the transistor Tr1 is turned to the off-state, so that an erase signal of a voltage of V2 volts is applied to the buffer 35 as shown in FIG. 4. Therefore, the erase signal of V2 volts shown in FIG. 2 is applied to the source 3 of the flash memory cell 1.

Also, the counter 33 outputs low-signal to both the output terminal OUTL and the output terminal OUTM until when a total number of counted erase signals reaches to M+1. Thus, both the transistor Tr1 and the transistor Tr2 are turned to the off-state, so that an erase signal of a voltage of V3 volts is applied to the buffer 35 as shown in FIG. 4. Therefore, the erase signal of V3 volts shown in FIG. 2 is applied to the source 3 of the flash memory cell 1.

As described in the above, the pulse signal P1 having lower voltage is outputted as an erase voltage by the pull back voltage generator 13 at initial phase of data erasion when a sufficient number of electrons are stored in the floating gate electrode 5. Therefore, generation of hot-holes at initial phase of pulling back of the electrons can be prevented.

On the other hand, difference in voltage between the source region 3 and the floating gate electrode 5 is decreased for the amount of electrons pulled out therefrom when the stored electrons in the floating gate electrode 5 are pulled out. So that, electrons can be pulled out from the floating gate electrode 5 more quickly as well as achieving less probability for generating the hot-holes even when the pulse P2 and P3 increased under stepwise bases are applied.

Thus, it is possible to carry out quick erasion and prevention of generating the hot-holes by applying the pulse shaped voltages shown in FIG. 2 increased under stepwise bases when the electrons stored in the floating gate electrode are pulled out by using a current flows under Fowler-Nordheim tunneling.

The number of the erase signals should be determined within a total of 1,000 times for shorting time of data erasion.

Decrease of difference between the threshold voltages of carrying out writing and erasing (so called "memory window") can be prevented because the hot-holes are not trapped in the gate oxidation layer 6 by employing a method for erasing.

In the embodiment described in the above, the pulse shaped voltages shown in FIG. 2 is applied. So that, it is possible to carry out data erasion with verifying the voltage of the floating gate electrode 5. As a result of that, each of the threshold voltages can be set at predetermined values. In this case, the voltages increased under stepwise bases should be determined in accordance with a value of voltage drop caused by pulling out of the electrons.

Although, the pulse shaped voltages are applied in the embodiment described herein, non pulse shaped voltage can be applied between the source and the floating gate electrode. In that case, the voltages can be varied by measuring duration of the voltage application.

Also, duty ratio of the pulse shaped signals can be varied with progress of data erasion. Further, verification of the voltage of the floating gate electrode 5 can be carried out at every receipt or once a several receipts of the erase signal or after data erasion is in certain progress.

Since number of the erase signal is counted by the counter 33 in the embodiment described herein, a count value outputted by the counter 33 can be provided to a circuit carried out verification of the count value.

The based erase signal generated by the erase signal generator 31 is varied at the voltage varying circuit 32 in the embodiment described herein. Any circuits which can generate and output a voltage increased under stepwise bases from the initial phase of pull back of electrons can be used for both of the erase signal generator 31 and the voltage varying circuit 32. For instance, one circuit which functions as both of the erase signal generator 31 and the voltage varying circuit 32 can be applied to the present invention.

Although, the pull back voltages shown in FIG. 2 are applied between the source region 3 and the control gate electrode 7 in this embodiment, the pulse shaped voltages can also be applied between the drain region 4 and the control gate electrode 7 as the pull back voltages.

Further, a positive voltage is applied to the source region 3 under a situation of grounding both the control gate electrode 7 and the substrate 2 in the embodiment described in the above. It is possible to turn both of the substrate 2 and the source region 3 to a level of the ground voltage, and the control gate electrode 7 is turned to a level of negative voltage. Still further, the voltages shown in FIG. 2 can be applied between the source region 3 and the control gate electrode 7 by turning the substrate 2 into a level of the ground voltage, and the source region 3 is turned to a level of a positive voltage and turning the control gate electrode 7 into a level of a negative voltage.

Though, the present invention is applied to the flash memory as in the above embodiment, it is also possible to apply the present invention to a memory circuit of a semiconductor device used for one-chip microcomputer.

The data erase signal is set as 5V at the initial phase of the data erasion, then the data erase signal is increased under stepwise bases such as 10V and 12V in the embodiment described in the above. It is not limited to increase the data erase signal under stepwise bases by the values mentioned above. Other values of data erase signal can be used under the conditions described in the above.

Lower pulse shaped voltage is applied at the initial phase of pull back of the electrons, in the semiconductor device including a nonvolatile memory and a method for using thereof. Therefore, generation of the hot-holes at the initial phase of pull back of the electrons can be prevented. Also, high voltages increased under stepwise bases are applied to the semiconductor device including a nonvolatile memory with progress of pull back of the electrons. Generation of the hot-holes can be prevented even when the pulse shaped voltages are increased. Because difference in voltage either of between the floating gate electrode and source region or between the floating gate electrode and the drain region is decreased when pulling out of the electrons is in much progress.

Thus, it is possible to prevent degradation of repeatability of data writing/data erasing as well as carrying out quick erasion by maintaining the pulse shaped voltage in a level of low at the initial phase of pull back of the electrons and by increasing that under stepwise bases.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A semiconductor device including a nonvolatile memory comprising:

a substrate have a source region and a drain region, a first insulating layer on the substrate, the first insulating layer being between source region and drain region, a floating gate electrode on the first insulating layer, a second insulating layer on the floating gate electrode, a control gate electrode on the floating gate electrode, and a pull back voltage generator applying predetermined voltages between either of the source region and the control gate electrode or the drain region and the control gate electrode, the pull back voltage generator having a counter circuit counting a number of voltage pulses at each of the predetermined voltages, the predetermined voltages being in low value at initial phase of pull back of electrons and being in high values increased under stepwise bases corresponding to the number of the pulse voltages counted by the counter circuit.

2. A semiconductor device including a nonvolatile memory in accordance with claim 1, wherein both of the substrate and the control gate electrode are turned into a level of ground voltage, and the source region is turned into a level of a positive voltage.

3. A semiconductor device including a nonvolatile memory in accordance with claim 1, wherein both the substrate and the source region are turned into a level of ground voltage, and the control gate electrode is turned into a level of a negative voltage.

4. A semiconductor device including a nonvolatile memory in accordance with claim 1, wherein the substrate is turned into a level of ground voltage, the source region is turned into a level of a positive voltage and the control gate electrode is turned into a level of negative voltage.

5. A semiconductor device including a nonvolatile memory in accordance with claim 1, wherein a value of the predetermined voltages at initial phase of data erasion is 5V, and values of the predetermined voltages are increased under stepwise bases.

6. A semiconductor device including a nonvolatile memory in accordance with claim 5, wherein a value of the predetermined voltages at final phase of data erasion is 12V.

7. A semiconductor device including a nonvolatile memory in accordance with claim 5, wherein the predetermined voltages are pulse shaped voltages, and a total number of the pulses for turning the nonvolatile memory into erase state are less than 1,000 pulses.

8. A method for using a semiconductor device including a nonvolatile memory having a source region, a drain region, a control gate electrode and a floating gate electrode characterized of:

applying predetermined voltages between either of the source region and the control gate electrode or the drain region and the control gate electrode for pulling back of electrons stored in the floating gate electrode to the source region or the drain region using a current flowing under Fowler-Nordheim tunneling, the predetermined voltages being in low value at initial phase or pull back of electrons and being in high values increased under stepwise bases corresponding to a number of counted pulse voltages at each of the predetermined voltages.

9. A method for using a semiconductor device including a nonvolatile memory in accordance with claim 8, wherein both of the substrate and the control gate electrode are turned into a level of ground voltage, and the source region is turned into a level of a positive voltage.

10. A method for using a semiconductor device including a nonvolatile memory in accordance with claim 8, wherein both the substrate and the source region are turned into a level of ground voltage, and the control gate electrode is turned into a level of a negative voltage.

11. A method for using a semiconductor device including a nonvolatile memory in accordance with claim 8, wherein the substrate is turned into a level of ground voltage, the source region is turned into a level of a positive voltage and the control gate electrode is turned into a level of negative voltage.

12. A method for using a semiconductor device including a nonvolatile memory in accordance with claim 8, wherein a value of the predetermined voltages at initial phase of data erasion is 5V, and values of the predetermined voltages are increased under stepwise bases.

13. A method for using a semiconductor device including a nonvolatile memory in accordance with claim 12, wherein a value of the predetermined voltages at final phase of data erasion is 12V.

14. A method for using a semiconductor device including a nonvolatile memory in accordance with claim 12, wherein the predetermined voltages are pulse shaped voltages, and a total number of the pulses for turning the nonvolatile memory into erase state are less than 1,000 pulses.

* * * * *